United States Patent [19]

Masuda et al.

[11] Patent Number: 4,682,563
[45] Date of Patent: Jul. 28, 1987

[54] JIG FOR SUPPORTING ARRAY OF ARTICLES TO BE SOLDERED AND DEVICE FOR TRANSFERRING ARTICLES TO JIG

[75] Inventors: Tsugunori Masuda, Hidaka; Shoji Muto, Sayama, both of Japan

[73] Assignee: Kabushiki Kaisha Tamura Seisakusho, Tokyo, Japan

[21] Appl. No.: 786,650

[22] Filed: Oct. 11, 1985

Related U.S. Application Data

[63] Continuation-in-part of Ser. No. 489,068, Apr. 27, 1983, abandoned.

[51] Int. Cl.$^4$ ............................................. B05C 13/02
[52] U.S. Cl. .................................. 118/503; 118/423; 269/903; 414/197
[58] Field of Search .................. 118/74, 423, 503; 134/61, 142; 198/342, 652, 653; 269/903; 29/760; 414/405, 414, 419, 425; 221/197, 198

[56] References Cited

U.S. PATENT DOCUMENTS

| | | | |
|---|---|---|---|
| 548,767 | 10/1895 | Vuillier | 118/503 |
| 2,870,728 | 1/1959 | Goodykoontz, Jr. | 29/760 X |
| 3,056,371 | 10/1962 | Frank | 118/423 X |
| 3,395,439 | 8/1968 | Palese et al. | 269/903 X |
| 3,640,519 | 2/1972 | Halstead | 29/760 X |
| 3,713,876 | 1/1973 | Lavrec | 118/423 X |
| 4,015,704 | 4/1977 | Warren | 198/652 |
| 4,222,166 | 9/1980 | Kurek et al. | 414/404 X |

OTHER PUBLICATIONS

Metzger et al., "Tape Feed Arrangement for Advancing Connector Terminals..." Western Electric Technical Digest, No. 44, Oct. 1976, pp. 45–46.

*Primary Examiner*—John P. McIntosh
*Attorney, Agent, or Firm*—James E. Nilles

[57] ABSTRACT

A jig for arraying and supporting a multiplicity of articles to be soldered wherein pairs of lower supporting wires are extended for supporting the lower side of respective articles between frame members adapted to be secured to a conveyor holder of a soldering line, pairs of upper supporting wires are arranged above the lower supporting wires in parallel with the latter along both side surfaces of respective articles, one end of each of the upper supporting wires being passed loosely through a hole formed on the frame member, and a gate member supporting the other ends of said upper supporting wires is provided movably up and down with respect to the frame member. A device for transferring articles to be soldered wherein a tiltable plate is rockably supported at its mid portion by a supporting bed through a support shaft for such a rocking motion so that one end thereof is lowered while the other end is raised and vice versa, a package fixing device is provided on the upper side of one end of the tiltable plate and adapted for fixing packages accommodating arrays of a multiplicity of articles to be soldered, and a mount guide member provided on the upper surface of the other end of the tiltable plate and provided with a multiplicity of guide grooves formed therein in alignment with the packages.

5 Claims, 18 Drawing Figures

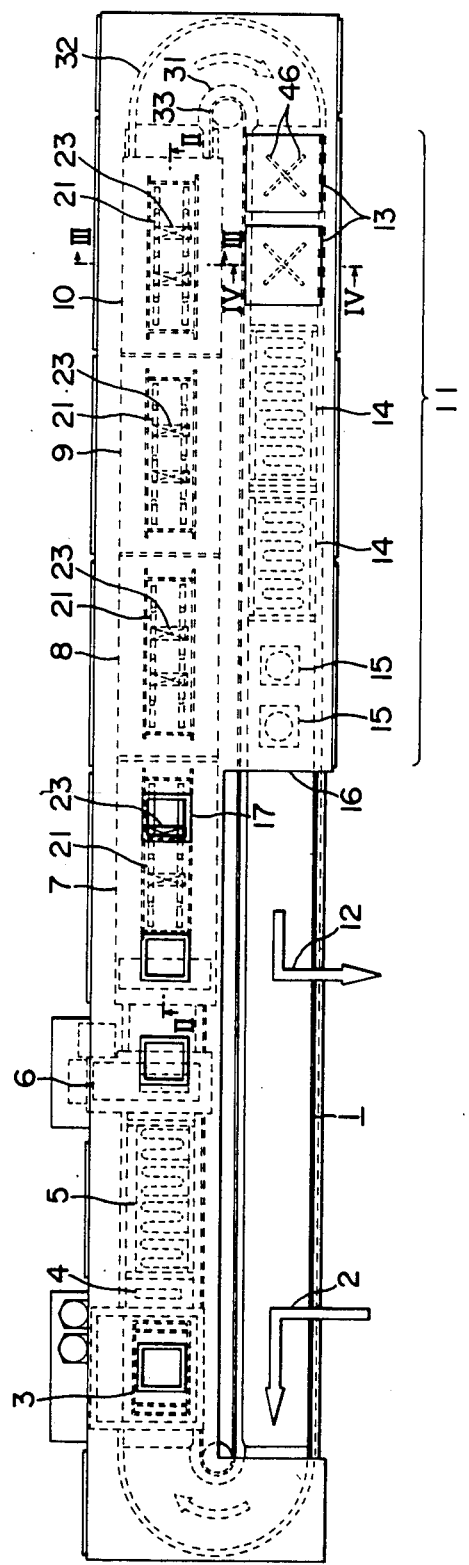
F I G. 1
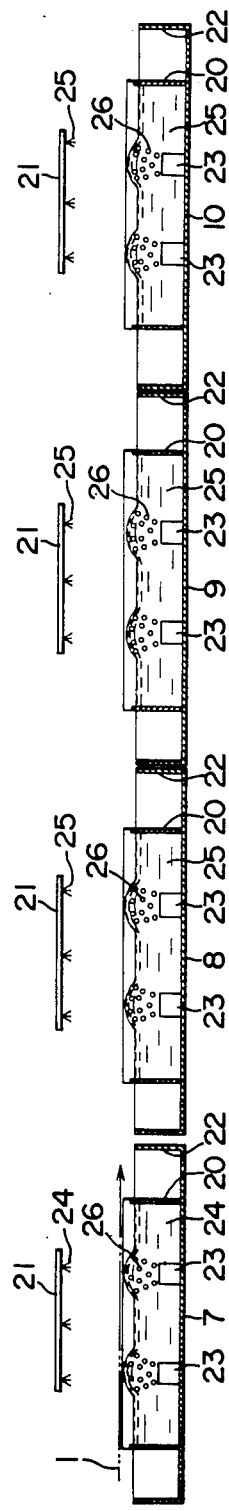
F I G. 2

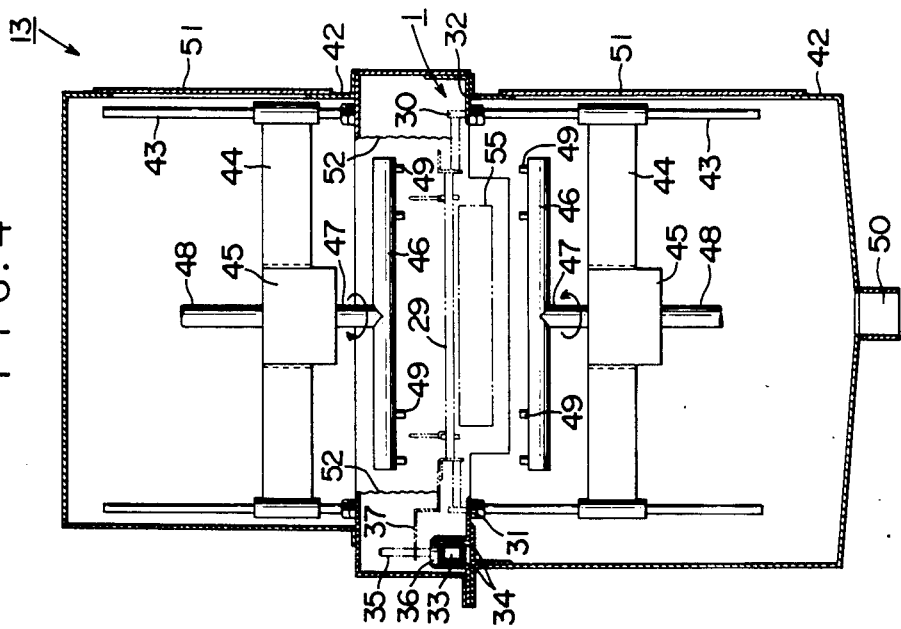
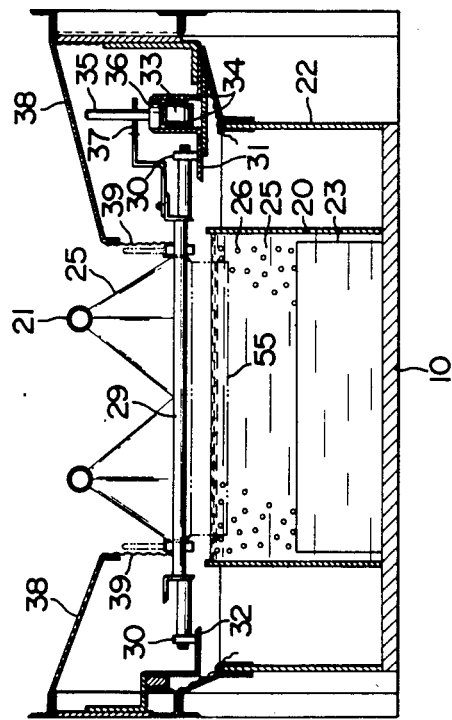

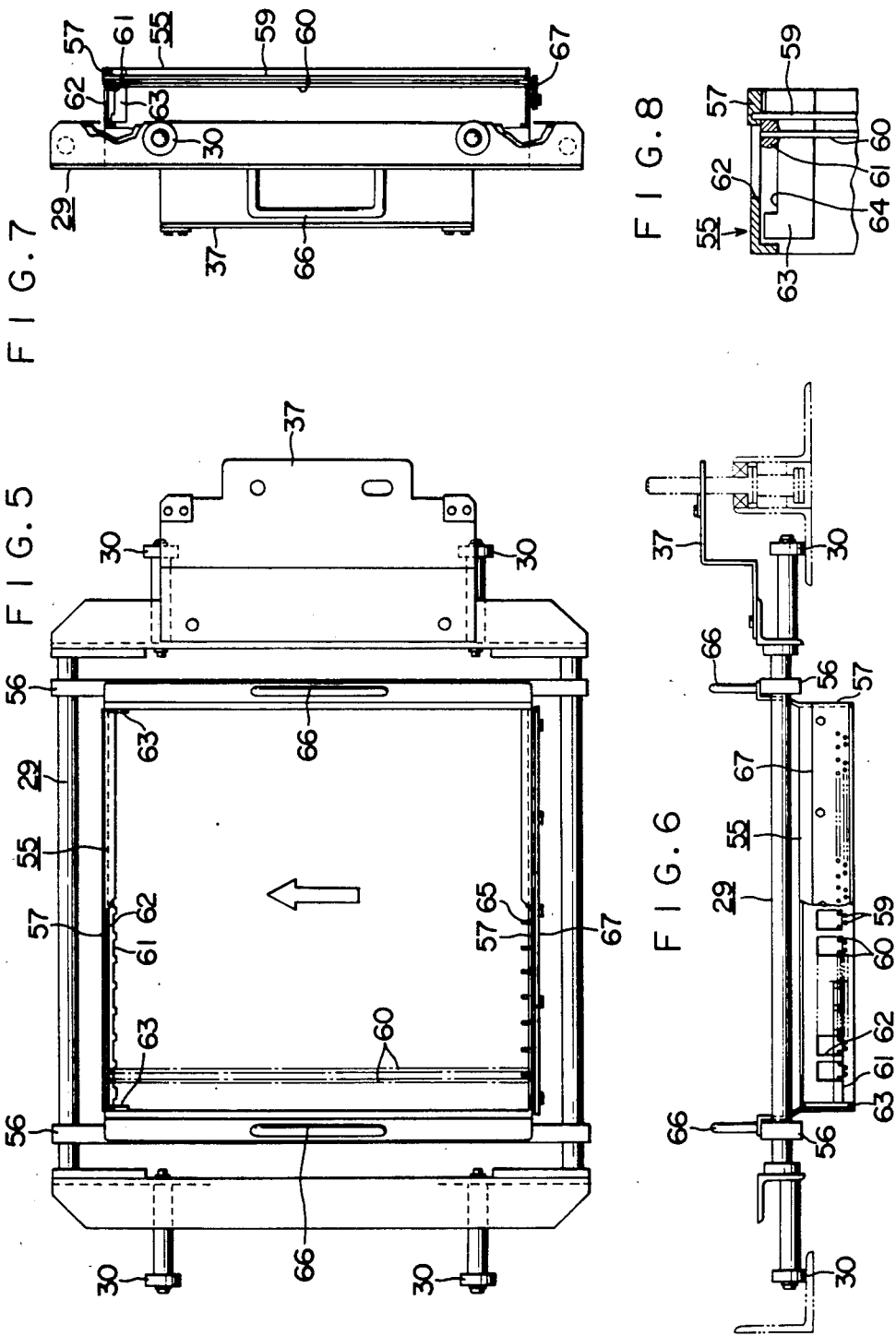

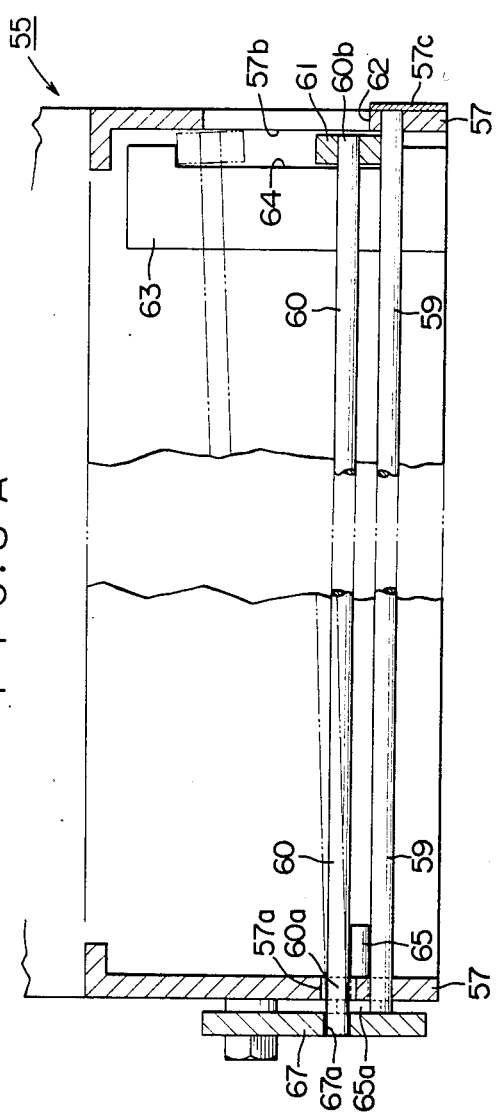
FIG. 8-A
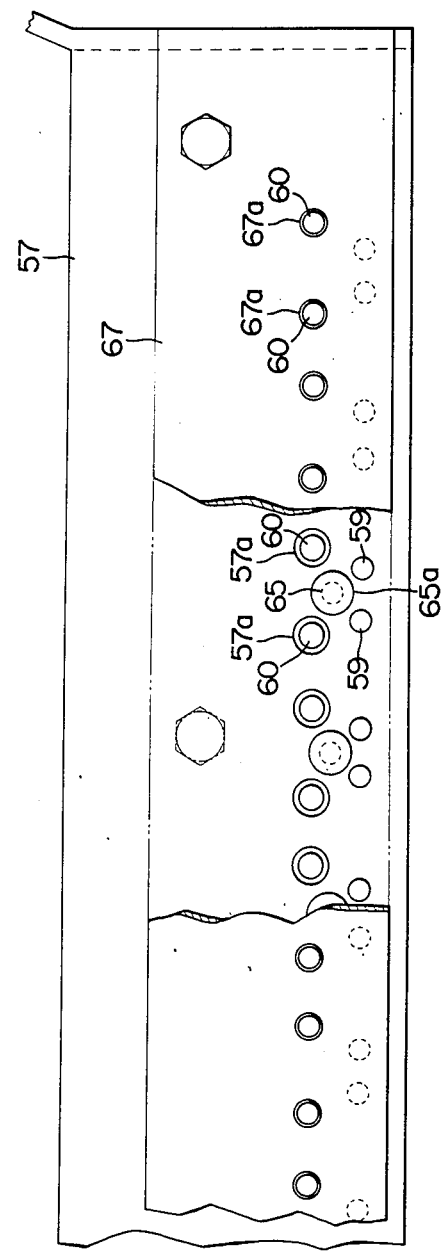
FIG. 8-B

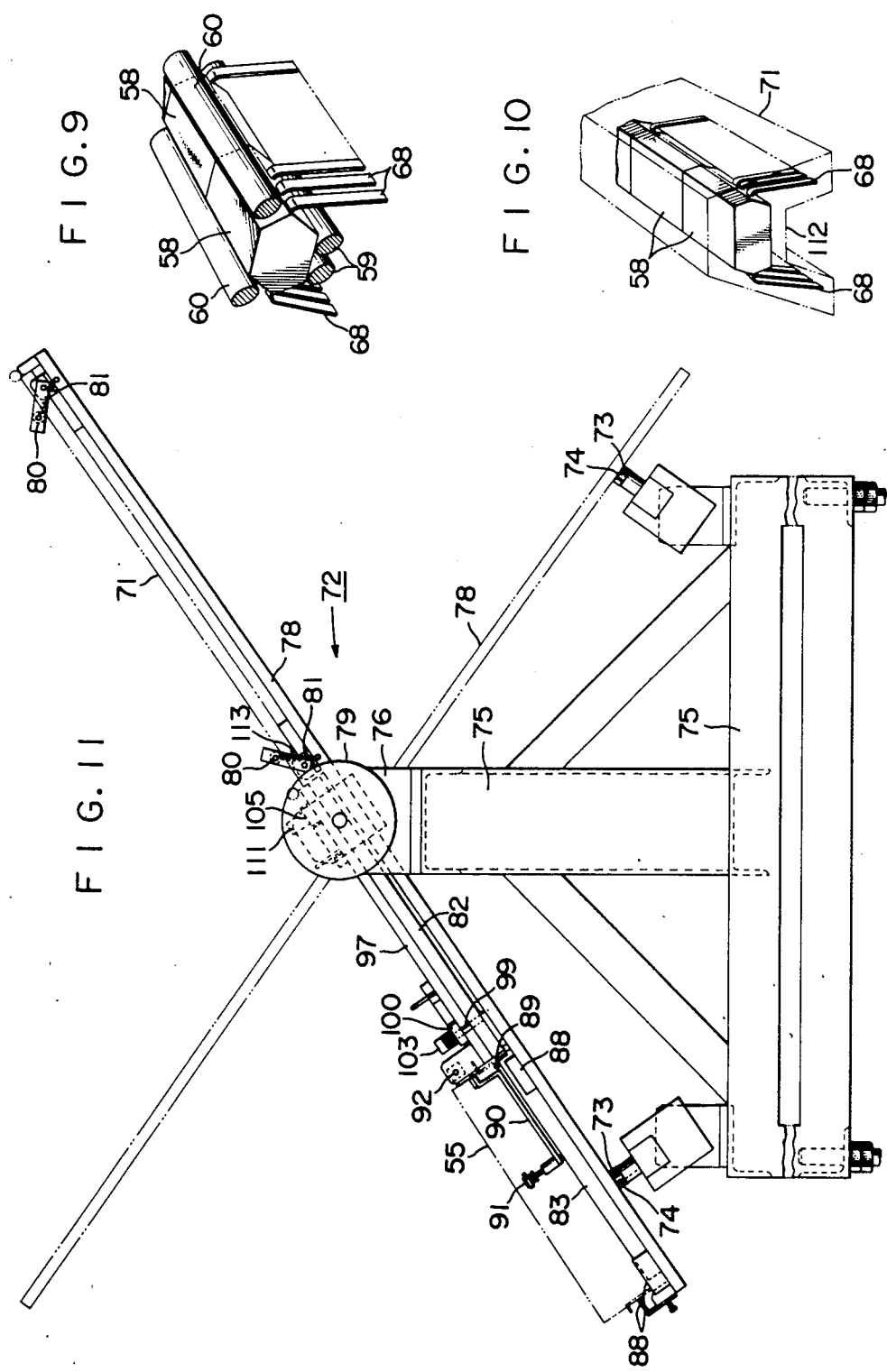

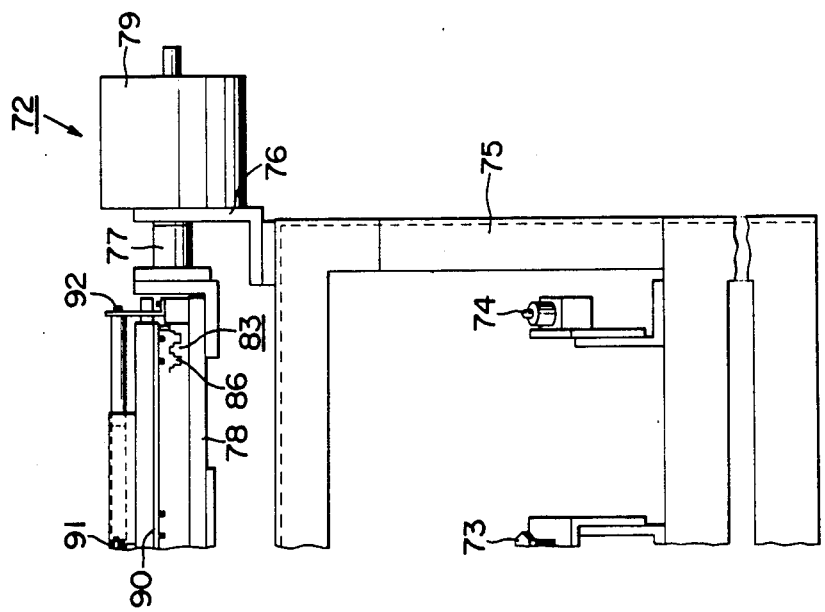
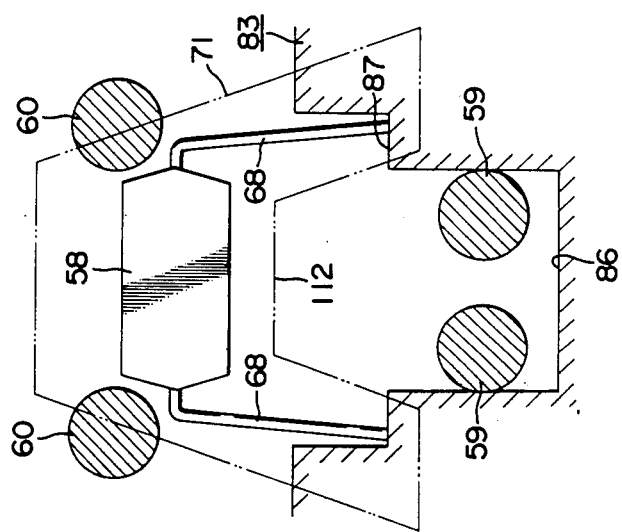

JIG FOR SUPPORTING ARRAY OF ARTICLES TO BE SOLDERED AND DEVICE FOR TRANSFERRING ARTICLES TO JIG

BACKGROUND OF THE INVENTION

1. Field of the Invention

This is a Continuation-In-Part of U.S. patent application Ser. No. 489,068, filed Apr. 27, 1983 now abandoned by T. Masuda et al for JIG FOR SUPPORTING ARRAY OF ARTICLES TO BE SOLDERED AND DEVICE FOR TRANSFERRING ARTICLES TO JIG, and abandoned as of the filing date of the present application.

The present invention relates to a jig for arraying and supporting a multiplicity of articles to be soldered, such as integrated circuits (ICs), which is used for mounting the array of such articles on a conveyor holder of an automatic soldering line in effecting a preliminary soldering of a solder film on the lead frames of the articles, and also to a device for transferring a multiplicity of articles to be soldered, such as an ICs, from a package to the jig of the type mentioned above.

2. Description of the Prior Art

Hitherto, there has been no simple jig for supporting array of articles to be soldered, as mentioned above, and for mounting the same on a conveyor holder, nor a device for transferring such articles from a package to the jig.

SUMMARY OF THE INVENTION

An object of the invention is to provide a jig which has a simple construction and can support an array of a multiplicity of articles to be soldered, such as ICs, in such a manner that the lead frames of these articles are projected downwardly.

Another object of the invention is to provide a device which can transfer at a time a multiplicity of articles to be soldered from a package to a jig for arraying and supporting the articles, and can transfer the articles from such a jig to an empty package.

To these ends, according to an aspect of the invention, there is provided a jig for arraying and supporting a multiplicity of articles to be soldered, characterized by comprising: a frame having frame members and adapted to be secured to a conveyor holder of a soldering line; pairs of rod shaped steel lower supporting wires extended between the frame members and adapted to support the lower side of respective articles; pairs of rod shaped steel upper supporting wires arranged above the lower steel wires in parallel with the latter along both side surfaces of respective articles, one end of the steel upper supporting wires being passed loosely through a hole formed on the frame member; a gate member supporting the other ends of the steel upper supporting wires and movable up and down with respect to the frame member; and article receiving ports formed in the frame member so as to oppose to the gate member.

According to another aspect of the invention, there is provided a device for transferring articles to be soldered, characterized by comprising: a supporting bed; a tiltable plate rockably supported at its mid portion by the supporting bed through a support shaft for such a rocking motion so that one end thereof is lowered while the other end is raised and vice versa; a package fixing means provided on the upper side of one end of the tiltable plate and adapted for fixing packages accommodating arrays of a multiplicity of articles to be soldered; and a mount guide member provided on the upper surface of the other end of the tiltable plate and provided with a multiplicity of guide grooves formed therein in alignment with the packages, the guide grooves being adapted to slidingly guide the legs of the articles to be soldered and receiving article supporting members which are positioned between the legs while the articles are on a jig for arraying and supporting the articles.

These and other objects, features and advantages of the invention will become clear from the following description of the preferred embodiments taken in conjunction with the accompany drawings.

BRIEF DESCRIPTION OF THE DRAWINGS

FIG. 1 is a plan view of an automatic soldering device;

FIG. 2 is a sectional view taken along the line II—II of FIG. 1;

FIG. 3 is a sectional view taken along the line III—III of FIG. 1;

FIG. 4 is a sectional view taken along the line IV—IV of FIG. 1;

FIG. 5 is a plan view of a conveyor holder and a jig;

FIG. 6 is a partly-sectioned front elevational view of the conveyor holder and jig as shown in FIG. 5;

FIG. 7 is a partly-sectioned side elevational view of the conveyor holder and jig as shown in FIG. 6;

FIG. 8-A is an enlarged side view of an essential part of the supporting wires;

FIG. 8-B is an enlarged front view of a frame and a pressing plate;

FIG. 9 is a perspective view showing how ICs are supported by the jig;

FIG. 10 is a perspective view of ICs in a package;

FIG. 11 is a front elevational view of a device for transferring articles to be soldered;

FIG. 13 is a side elevational view of the device shown in FIG. 11;

FIG. 14 is an enlarged sectional view of a mount guide member;

DESCRIPTION OF THE PREFERRED EMBODIMENTS

Figure 12:
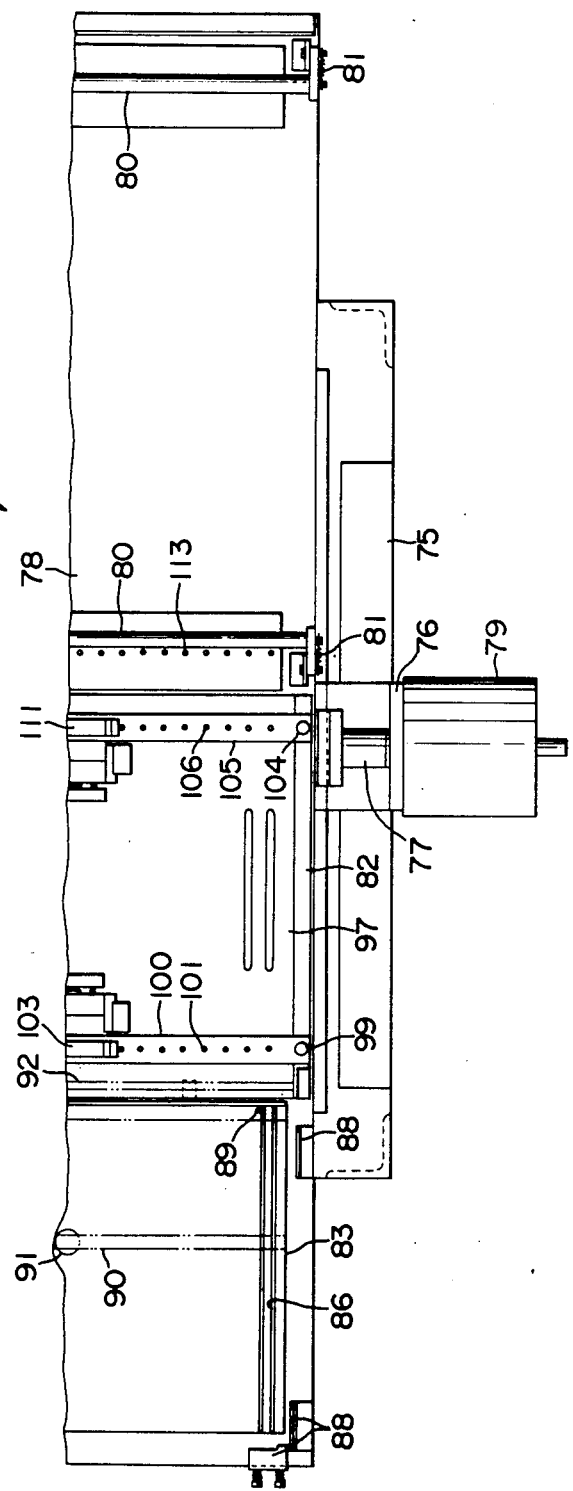
FIG. 12 is a plan view of the device shown in FIG. 11.

A typical system for effecting soldering on articles to be soldered such as ICs includes the following sections or stations disposed in series as shown in FIG. 1 along a conveyor 1 which conveys articles to be soldered: namely, an article pickup section 2, a flux applying unit 3 having a waving flow type flux cell containing a water-soluble chloric flux, an air knife 4 having an air jetting nozzle and adapted to remove surplus flux, a preheating unit 5 having a heater, a soldering unit 6 having a solder cell, a hot water rinsing unit 7 adapted to remove residual flux from the articles by hot water of about 80° C., three cold water rinsing units 8, 9 and 10, drying means 11 and an article delivering section 12.

The drying means 11 includes a pair of rotary air blow units 13, a pair of heating units 14 consisting of heaters, and a pair of cooling fan units 15.

The conveyor 1 is covered over almost the entire part thereof with a hood 16 except the article pickup and delivery sections 2 and 12, so that the gas generated from the flux and solder is prevented from being released into the room. The gas is discharged to the outside of the room through a duct 17.

The parts constituting the sections and stations mentioned above, as well as the conveyor 1 itself, are made from stainless steel or coated with an anti-acid paint.

As shown in FIGS. 2 and 3, each of the hot water rinsing unit 7 and the cold water rinsing units 8, 9 and 10 includes an air bubbling water tank 20 disposed at the lower side of the conveyor 1 and a shower 21 disposed above the conveyor 1.

The air bubbling tank 20 is mounted in an outer tank 22 and is provided at its bottom with two air jetting nozzles 23. The air blown from these nozzles 23 ascends from the top opening of the nozzle 23 in the form of a multiplicity of air bubbles. The ascending movement of the air bubbles 26 causes an upward flow of hot water 24 or cold water 25 at a high velocity within the water tank 20 to strongly collide with the articles to be soldered. The upward flow of hot or cold water colliding with the article, in cooperation with the stirring effect provided by the air bubbles 26, effectively removes and washes away the water-soluble chloric flux remaining on the article. The shower 21 has two rows of pipes, each provided at its lower side with three water nozzle ports.

Referring now to FIG. 3, the conveyor 1 includes a frame-like conveyor holder 29, an inner peripheral endless rail 31 and an outer peripheral endless rail 32 which cooperate with each other in supporting rollers 30 of the conveyor holder 29, and a conveyor endless chain 33 disposed along the inner peripheral endless rail 31. The conveyor endless chain 33 is adapted to move while being guided by a pair of guide rails 34 and is provided with a plurality of upwardly extending conveyor pins 35 at a predetermined pitch. A bearing 36 is fitted around each pin 35 to smooth the movement of the pin 35. The pins 35 engage vertically movable with an engaging plate 37 which projects from one side of the conveyor holder 29. The endless rails 31 and 32 on both sides are covered by a detachable waterproof cover 38 and a waterproof cover 39.

As shown in FIG. 4, the rotary air blow unit 13 has the following construction. Namely, four upward supporting rods 43 and four downward supporting rods 43 are projected from an intermediate part in a tank 42. An upper rotary joint 45 and a lower rotary joint 45 are supported by the supporting rods 43 through supporting plates 44. An upper rotary pipe 46 and a lower rotary pipe 46, rotatably disposed at both sides of the conveyor 1, have hollow rotary shafts 47 which are connected to an upper air supply pipe 48 and a lower air supply pipe 48 through the upper and lower rotary joints 45, 45, respectively. Air nozzles 49 are projected from the upper and lower rotary pipes 46 somewhat obliquely rearwardly. In operation, the upper and lower air nozzles 49 jet air to produce a reactional force thereby to rotate respective rotary pipes 46. In consequence, the water droplets attaching to the conveyor holder 29 and the articles to be soldered are blown off by the air jet. The arrangement is such that the upper and lower rotary pipes 46 rotate in opposite directions. The whole portion of the tank 42, except a bottom drain port 50, is covered by, for example, a transparent acrylic plate 51. A reference numeral 52 designates a waterproof sheet. It is possible to integrate the air supply pipe 48 with the rotary hollow shaft 47 of the rotary pipe 46 to make it possible to forcibly rotate the air supply pipe 48.

As shown, for example, in FIGS. 5 to 7, a jig 55 for arraying and supporting the article to be soldered is inserted into the conveyor holder 29 from the upper side of the conveyor holder 29. The jig 55 includes a frame 57 made of titanium and retained by supporting portions 56 on both sides of the conveyor holder 29, rod shaped lower supporting wires 59 made of tungsten steel (having a property of anti-corrosion and hardness) and arranged in a plurality of pairs and extended between the lower portions of the frames 57, the lower wires 59 being adapted to support the lower side of the body of the integrated circuits (referred to as "IC" or "ICs", hereinunder) as the article to be soldered, as shown in FIG. 9, rod shaped upper supporting wires 60 made of tungsten steel (having a property of anti-corrosion and hardness) and arranged in pairs, the upper wires 60 extending along both side surfaces of the bodies of ICs above the lower wires 59, one end 60a of said each upper supporting wire 60 (left end portion in FIG. 8-A) being passed loosely through a hole 57a formed on the frame 57, a gate member 61 secured on the other end 60b of the each upper supporting wire 60 (right end portion in FIG. 8-A) and disposed so as to be movable up and down with respect to the frame 57, and IC receiving port 62 formed in the frame 57 opposite to the gate member 61 and adapted to receive the articles to be soldered.

As shown in FIGS. 8-A and 8-B, one end 60a of said upper supporting wire 60 is passed loosely through the hole 57a formed on the frame 57 and further passed loosely through a hole 67a formed on the pressing plate 67 fixed on the frame 57 by screws. Accordingly, said upper supporting wire 60 can be inclined within said holes 57a, 67a.

The other end 60b of the upper supporting wire 60 is press fitted into a hole formed on the gate member 61 or welded to the gate member 61 to secure therewith.

The gate member 61 is supported vertically movably at its both ends by a recess 64 formed between a guide plate 63 and the inner side 57b of the frame 57. As shown in FIG. 8-A, a clearance is formed between the both ends of the gate member 61 and the guide plate 63 and the frame 57 facing thereto, respectively, so that the gate member 61 can be inclined within said recess 64. The gate member 61 cannot be removed from the recess 64, because the gate member 61 is supported at both ends thereof by said guide plate 63 and a portion of said frame 57, and accordingly the upper supporting wire 60 fixed on said gate member 61 cannot be slid axially to a large extent in said holes 57a and 67a.

Further, stopper pins 65 are formed to project from the inner surface of the frame 57 opposite to the gate 61, substantially at the central portions of the area defined by two upper supporting wires 60 and corresponding two lower supporting wires 59 thereby to retain the IC 58 on one end. Knobs 66 are provided on the upper surfaces of lateral portions of the frame 57.

For an easy securing of the lower supporting wire 59, one end thereof at the IC receiving port 62 is extended through the frame 57 and fixed on a stopper plate 57c welded on the frame 57 and the other end at the pin 65 is extended through the frame 57 and fixed on the pressing plate 67 outside of the frame 57. At the same time, the pins 65 are extended from the outside through the frame 57 and are pressed at their outer flange portions 65a by the pressing plate 67 thereby to easily secure the frame 57.

According to the above construction, as shown in FIG. 8-A, when the gate member 61 is lifted, the other end 60b of the upper supporting wire 60 is also lifted. In this operation, one end 60a of the upper supporting wire 60 is inserted loosely through the holes 57a, 67a formed on the end plate of the frame 57 and the pressing plate 67, respectively, and the upper supporting wire 60 is long, so that one end 60a of the upper supporting wire 60 is slightly changed in its angular position in the holes 57a, 67a, thereby causing the upper supporting wire 60 to be inclined upwardly centering about the one end 60a, while maintaining a linear form. Thus an insertion opening 62 can be formed here and IC 58 to be soldered can be inserted continuously therethrough on the lower supporting wire 59 by lifting the gate member 61. When the lifted gate member 61 is released, the gate member 61 with the upper supporting wire 60 descends by its own weight, so that the insertion opening 62 is closed. The upper supporting wire 60 is maintained linearly in parallel with the lower supporting wire 59 and presses downwards by its own weight both side inclined surfaces of a plurality of ICs 58, so that the ICs 58 are held on the lower supporting wire 59, as shown in FIG. 9. In this state, the ICs in each line are constrained in a space between the gate member 61 and the pin 65 and cannot be passed through the insertion opening 62.

In this state, lead frames 68 of the ICs are projected downwards through a space between the upper supporting wires 60 and the lower supporting wires 59, as shown in FIG. 9.

According to the invention, as shown in FIG. 10, a multiplicity of ICs 58 arrayed in series within a package 71 are transferred to and mounted on the above-mentioned arraying and supporting jig 55, by means of an article transfer device 72 which will be explained hereinunder with reference to FIGS. 11 to 13.

The transfer device 72 has the following construction. A pair of supporting plates 76 are mounted on a support bed 75 having stoppers 73 and shock absorbers 74. A tiltable plate 78 is rotatably supported at its central portion by means of a support shaft 77 which in turn is rotatably supported by the pair of support plates 76. The support shaft 77 is operatively connected to the rotary shaft of a rotary actuator 79 which has a main body fixed to the support plate 76. One and the other ends of the tiltable plate 78 is swung up and down around a fulcrum constituted by the support shaft 77. The tiltable plate 78 is provided at its upper side of right end as viewed in FIG. 11 with a package fixing means which is constituted by a pair of fixing bars 80 for fixing both ends of a multiplicity of rows of packages 71 accommodating a plurality of rows of ICs and a spring 81 for urging the fixing bars 80 downwardly. The tiltable plate 78 is provided on the upper surface of the left end thereof as viewed in FIG. 11 with an intermediate guide member 82 and a mount guide member 83.

As will be seen from FIGS. 13 and 14, the mount guide member 83 is provided in its upper surface with a multiplicity of concaved guide grooves 86 aligning with the axes of the multiplicity of packages 71. The arrangement is such that the lead frames 68 of the ICs are slid along the steps 87 formed in the mid portions of the guide grooves 86. Further, the lower supporting wires 59, serving as the supporting members for supporting the article to be soldered, and placed between the lead frames 68 of the ICs 58, are received by the guide grooves 86 and extended at the lower side of the steps 87. Jig locating members 88 are disposed around the mount guide member 83, while push-up pins 89 are projected from both sides of the right end of the mount guide member 83 as viewed in FIG. 11. The arrangement is such that the push-up pins 89 push up the gate member 61 of the jig 55 for arraying and supporting the articles to be soldered. A cover member 90 is provided on the upper side of the left half part of the mount guide member 83 as viewed in FIG. 11 so as to prevent the ICs 58 from coming off from the guide grooves 86. The cover member 90 is rotatable around the support shaft 92 by means of a knob 91.

Figure 15:
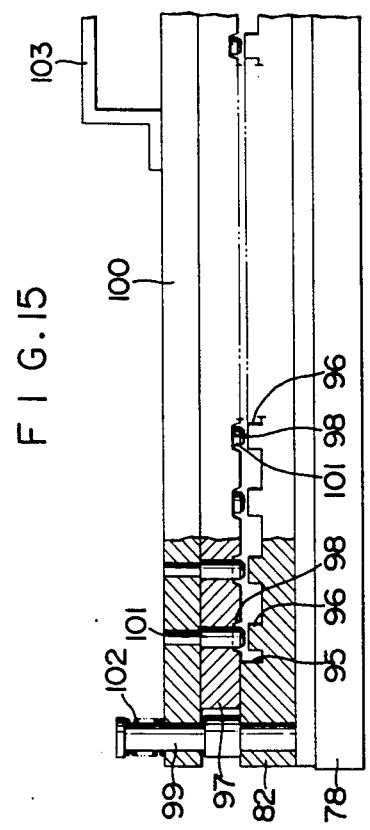
FIG. 15 is a sectional view of a gate portion of an intermediate guide member.
Figure 16:
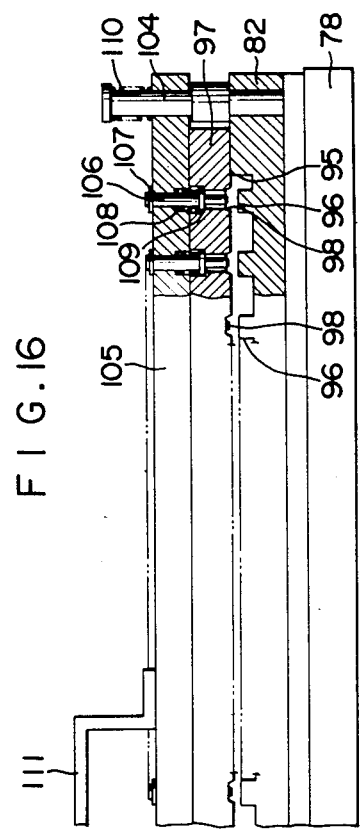
FIG. 16 is a sectional view of a stopper portion of the intermediate guide member.

As will be seen from FIGS. 15 and 16, the intermediate guide member 82 has a recess 95 formed in the upper surface thereof and provided with a multiplicity of protrusions 96 formed in the recess in alignment with the multiplicity of rows of packages 71. The arrangement is such that the ICs are made to ride the protrusions 96 and slide along the same. The whole portion of the upper side of the intermediate member 82 is covered by a cover member 97 fixed thereto. The cover member 97 is provided in the lower surface thereof with a plurality of guide recesses 98 opposing to the ridges 96. In addition, guide bars 99 are protruded from both side portions of the intermediate guide member 82 adjacent to the mount guide member 83. A gate actuating member 100 is vertically movably held by the guide bars 99. Gate pins 101 are projected from the gate actuating member 100 towards respective guide ridges 96 through the cover member 97. The gate actuating member 100 is urged downwardly by a spring 102 but the gate pins 101 are retractable from respective guide recesses 98 as desired as a handle 103 is lifted. Similarly, guide bars 104 are projected from both side portions of the intermediate guide member 82 adjacent to the package 71. A stopper actuator 105 is engaged at its both ends vertically movably by means of both guide bars 104. A stopper actuator 105 is engaged at its both ends vertically movably by means of both guide bars 104. Further, stopper pins 106 are attached to the stopper actuating member 105 so as to project therefrom towards the guide ridges 96 through the cover member 97. The stopper pin 106 has an upper end retaining portion 107 engaging with the top surface of the stopper actuating member 105 and is provided at its intermediate portion with a flange 109 upon which a spring 108 in the stopper actuating member 105 and the cover member 97 acts to urge the stopper pin 106 to project the lower end of the latter downwardly into the guide recess 98. The stopper actuating member 105 is urged downwardly by a spring 110, but the stopper pins 106 are retractable from respective guide recesses 98 as desired by lifting a handle 111. The reason why the gate pins 101 and the stopper pins 106 are movable vertically is to divide the rows of ICs in the package 71 into two equal sections thereby to permit the transfer of the ICs to the arraying and supporting jig 55 in two times successively. It is possible to divide the IC rows into three or more equal parts by a simple modification.

The transfer of the ICs 58 from the packages 71 to the jig 55 for arraying and supporting the articles to be soldered is conducted in a manner explained hereinunder. As shown by two-dot-and-dash line in FIG. 11, the tiltable plate 78 is positioned such that its right side portion is lowered. The package 71 accommodating a multiplicity of rows of ICs having lower recesses 112 located by locating pins 113 is disposed at one side of the tiltable plate 78. The package 71 is pressed and fixed at its both ends by the fixing bars 80 so that one open end of the package 71 is connected to the end of the intermediate guide member 82. At the same time, an empty jig 55 is placed on the mount guide member 83, and the lower supporting wires 59 of this jig 55 are placed in the lower side of the step 87 in the guide groove 86 as shown in FIG. 14. At the same time, one end of the upper supporting wires 60 are opened above the IC receiving ports 62 of the jig 55 by moving the gate member 61 of the jig 55 by means of the push-up pins 89. The rotary actuator 79 is started in this state to decline the tiltable plate 78 in the opposite direction as shown by full line in FIG. 11, so that the ICs 58 in the package 71 of each row tend to slide downwardly by the force of gravity. The ICs 58, however, are tentatively stopped by the stopper pins 106, the lower ends of which project into the guide recesses 98 as shown in FIG. 16. Then, as the stopper pins 106 are retracted from the guide recesses 98 by moving the handle 111 upward to lift the stopper actuating member 105, the ICs 58 are allowed to slide downwardly through the gap between the stopper pin 106 and the guide ridges 96 until they are retained by the gate pins 101 which project as shown in FIG. 15. Then, as the handle 111 is released, the stopper pins 106 presses the ICs taking intermediate position in each IC row against the guide ridges 96 to hold these ICs, by the action of the springs 108 and 110. Then, as the gate actuating member 100 is moved upward by the lifting of the handle 103, the gate pins 101 are retracted from the guide recesses 98 so that a multiplicity of ICs 58 held between the stopper pins 106 and the gate pins 101 are transferred onto two lower supporting wires 59 through the gap between the gate pins 101 and the guide ridges 96 and through the IC receiving ports 62 in the jig 55, via the lower side of the gate 61 of the jig 55. In this state, the lower supporting wires 59 are placed at the lower side of the steps 87 in the guide grooves 86 in the mount guide member 83 as shown in FIG. 14, so that the lead frames 68 of the ICs slide along the steps 87.

As the jig 55 with the lower supporting wires 59 carrying a multiplicity of ICs 58 is lifted and removed from the mount guide member 83, the gate 61 is released from the push-up pins 89 and lowered until the upper supporting wires 60 of each pair presses the upper parts of both side surfaces of the body of IC 58 thereby to firmly secur the latter. The jig 55 thus loaded with ICs 58 is then brought into engagement with the conveyor holder 29 as shown in FIGS. 5 thru 7, at the article pickup section 2 shown in FIG. 1. In consequence, the ICs 58 are moved together with the jig 55 and, hence, with the conveyor holder 29.

Then, the water-soluble chloric flux is applied to the lead frames 68 of the ICs 58 by the flux applying unit 3, and the surplus flux is blown off by means of the air knife 4. The lead frames 68 of the ICs are then preheated by the preheating unit 5 and solder films are deposited onto the lead frames 68 by the soldering unit 6. Then, hot water 24 and cold water 25 are applied to the holder 29 and the jig 55 by means of the upper showers 21 in the hot water rinsing unit 7 and the cold water rinsing units 8, 9 and 10. At the same time, the upward gas-liquid mixture jet is applied to the jig 55 and the ICs 58 by means of the air bubbling tank 20 disposed at the lower side, thereby to wash away the flux depositing to the holder 29, jig 55 and the ICs 58. Then, the water droplets attaching to the holder 29, jig 55 and the ICs 58 are blown off by the air jetted from the upper and lower sides by means of the rotary air blow units 13. Subsequently, a drying is effected by the heating unit 14 followed by a cooling which is effected by a cooling fan unit 15. Finally, the jig 55 is demounted from the holder 29 at the article delivering section 12.

Subsequently, the jig 55 accommodating ICs 58 with lead frames 68 having solder films formed thereon is located on the mount guide member 83 of the article transfer device 72. Meanwhile, the tiltable plate 78, which carries a multiplicity of vacant packages 71 on the top of right side portion of the tiltable plate 78 as shown in FIG. 11, is swung from the position shown by full lines to the position shown by two-dot-and-dash lines in FIG. 11, by the operation of the rotary actuator 79, and the gate pins 101 and the stopper pins 106 are withdrawn so that the ICs 58 in the jig 55 are easily returned to the vacant package 71. The hot water rinsing unit 7 and the cold water rinsing units 8, 9 and 10 may incorporate ultrasonic cleaning devices.

As has been described, according to the invention, there is provided a jig for arraying and supporting articles to be soldered, comprising pairs of lower supporting wires extended between two frame members, pairs of upper supporting wires above the lower supporting wires, the upper supporting wires being loosely attached at their one ends to one frame member and at their other ends to a gate member which is movable up and down relatively to the frame member, and article receiving ports formed in the frame member and opposing to the gate member. It is, therefore, possible to array and support, by the cooperation of four supporting wires, including two upper supporting wires and two lower supporting wires, a multiplicity of articles to be soldered such as ICs in such a manner that the lead frames of the ICs are projected downwardly through the gap between the upper and lower supporting wires. Thus, the jig of the invention can suitably be used as the jig for effecting a soldering on the lead frames. In fact, a multiplicity of articles to be soldered are inserted to the spaces defined by respective four supporting wires through the article receiving ports, simply by lifting the gate member.

On the other hand, the invention provides also a device for transferring articles to be soldered, characterized by comprising: a supporting bed; a tiltable plate rockably supported at its mid portion by the supporting bed through a support shaft for such a rocking motion that one end thereof is lowered while the other end is raised and vice versa; a package fixing means provided on the upper side of one end of the tiltable plate and adapted for fixing packages accommodating arrays of a multiplicity of articles to be soldered; and a mount guide member provided on the upper surface of the other end of the tiltable plate and provided with a multiplicity of guide grooves formed therein in alignment with the packages, the guide grooves being adapted to slidingly guide the legs of the articles to be soldered and receiving article supporting members which are positioned between the legs while the articles are on a jig for arraying and supporting the articles. With this device, it is possible to easily set the jig simply by placing the same on the mount guide member with the guide grooves aligning the packages. It is also possible to transfer a multiplicity of articles to be soldered from the packages to the article supporting members in the jig at one time by the tilting of the tiltable plate, and to transfer the articles from the jig to the vacant packages.

Although the invention has been described through specific terms, it is to be noted here that the described embodiments are not exclusive and various changes and modifications may be imparted thereto without departing from the scope of the invention which is limited solely by the appended claims.

What is claimed is:

1. A jig for arraying and supporting a multiplicity of articles to be soldered, characterized by comprising: a frame having frame members and adapted to be secured to a conveyor holder of a soldering line; pairs of rod shaped lower supporting wires extended between said frame members and adapted to support the lower side of respective articles; pairs of rod shaped upper supporting wires arranged above said lower supporting wires in parallel with the latter along both side surfaces of respective articles, one end of each of said upper supporting wires being passed loosely through a hole formed on said frame member; a gate member secured on the other end of each of said upper supporting wires and movable up and down with respect to said frame member; and article receiving ports formed in said frame member opposite to said gate member.

2. A jig for arraying and supporting a multiplicity of articles to be soldered, characterized by comprising: a frame having frame members and adapted to be secured to a conveyor holder of a soldering line; at least one pair of rod shaped lower supporting wires extended between said frame members and adapted to support the lower side of respective articles; at least one pair of rod shaped upper supporting wires arranged above said lower supporting wires in parallel with the latter along both side surfaces of respective articles, means for loosely supporting one end of each upper supporting wire to one of said frame members; a gate member secured on the other end of each of said upper supporting wires and movable up and down with respect to the other of said frame members; and article receiving ports formed in said other frame member opposite to said gate members.

3. In combination:
a device for unloading and transferring articles to be soldered from a package mountable therein, said articles being arranged end-to-end in said package;
and a jig detachably mountable on said device for receiving said articles as they are transferred and for arraying and supporting them while they are being soldered;
said device comprising:
a tiltable member pivotable between lowered and raised positions;
means for securing said package to said tiltable member so that said articles slide from said package when said tiltable member is pivoted to raised position;
means for detachably mounting said jig on said tiltable member;
and guide means on said tiltable member for guiding said articles from said package to said jig when said tiltable member is pivoted to raised position;
said jig comprising:
a frame having spaced apart frame members at opposite ends;
one of said frame members confronting said guide means and having an article-receiving port therein;
at least one pair of laterally spaced apart lower supporting wires extending between said frame members and adapted to receive and support a lower side of said articles;
at least one pair of laterally spaced apart upper supporting wires arranged above and parallel to said lower supporting wires and adapted to receive and support opposite lateral sides of said articles,
means for loosely securing one end of each upper supporting wire to the other of said frame members so that the other end of each said upper supporting wire can be raised and lowered;
a gate member secured to and movable with said other end of each said supporting wires for blocking said article receiving port when the upper support wire is lowered and for unblocking said port when the upper support wire is raised so as to permit passage of said articles from said guide means into said jig;
and push-up pin means on said tiltable member engageable with the gate members to effect raising of said gate members and their associated upper supporting wires when said jig is mounted on said tiltable member of said device.

4. The combination according to claim 3:
wherein said device further comprises means for pivotally supporting said tiltable member intermediate the opposite ends of said tiltable member so that one of said ends is lowered while the other of said ends is raised and vice-versa;
wherein each of said articles comprises spaced apart legs between which said pair of lower supporting wires of said jig are receivable;
and wherein said guide means on said tiltable member comprises at least one guide groove disposed in alignment with a package secured to said tiltable member, said guide groove being adapted to slidingly guide said legs of said articles and to receive said pair of lower supporting wires which are positioned between said legs while said articles are on said jig.

5. The combination according to claim 4 wherein said means for pivotally supporting said tiltable member comprises a support bed having a support shaft for pivotally supporting said tiltable member.

* * * * *